US007547900B2

(12) United States Patent
Renau et al.

(10) Patent No.: US 7,547,900 B2
(45) Date of Patent: Jun. 16, 2009

(54) TECHNIQUES FOR PROVIDING A RIBBON-SHAPED GAS CLUSTER ION BEAM

(75) Inventors: Anthony Renau, West Newbury, MA (US); Joseph C. Olson, Beverly, MA (US); Jonathan Gerald England, Horsham (GB)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 177 days.

(21) Appl. No.: 11/615,290

(22) Filed: Dec. 22, 2006

(65) Prior Publication Data

US 2008/0149826 A1 Jun. 26, 2008

(51) Int. Cl.
*G21K 5/04* (2006.01)
*G21K 5/10* (2006.01)
*H01J 37/317* (2006.01)

(52) U.S. Cl. .............................. 250/492.21; 250/492.1; 250/492.2; 250/492.3

(58) Field of Classification Search ............. 250/423 R, 250/424, 425, 492.1, 492.2, 492.21, 492.3; 313/359.1, 363.1; 315/111.01, 111.11, 111.21, 315/111.81, 111.91; 118/723 FI, 723 CB
See application file for complete search history.

(56) References Cited

U.S. PATENT DOCUMENTS

| | | | |
|---|---|---|---|
| 3,676,672 A * | 7/1972 | Meckel et al. ................ 250/427 |
| 4,152,478 A | 5/1979 | Takagi | |
| 4,318,028 A * | 3/1982 | Perel et al. ............. 315/111.81 |
| 4,737,637 A | 4/1988 | Knauer | |
| 4,942,342 A | 7/1990 | Tsukakoshi | |
| 5,091,655 A | 2/1992 | Dykstra et al. | |
| 5,177,366 A | 1/1993 | King et al. | |
| 5,180,918 A | 1/1993 | Isobe | |
| 5,350,926 A * | 9/1994 | White et al. ........... 250/492.21 |
| 6,331,227 B1 | 12/2001 | Dykstra et al. | |
| 6,629,508 B2 | 10/2003 | Dykstra | |
| 6,774,377 B1 | 8/2004 | Rathmell et al. | |
| 6,998,625 B1 * | 2/2006 | McKenna et al. ...... 250/492.21 |
| 7,060,989 B2 * | 6/2006 | Swenson et al. ........ 250/423 R |
| 2004/0112542 A1 * | 6/2004 | Collins et al. .......... 156/345.48 |
| 2004/0262542 A1 * | 12/2004 | Rathmell et al. ....... 250/492.21 |
| 2005/0205801 A1 * | 9/2005 | Mack et al. ............. 250/423 R |
| 2006/0097185 A1 * | 5/2006 | Mack ..................... 250/423 R |
| 2006/0118731 A1 * | 6/2006 | Saito et al. .................. 250/427 |
| 2007/0187615 A1 * | 8/2007 | Low et al. ................... 250/397 |
| 2008/0073581 A1 * | 3/2008 | Ikejiri .................... 250/492.21 |

(Continued)

OTHER PUBLICATIONS

Yamada, "Current Research and Development Topics on Gas-Cluster Ion-Beam Processes", Journal of Vacuum Science Technology A23(4), Jul.-Aug. 2005, 1090-1099.*

(Continued)

*Primary Examiner*—Jack I Berman
*Assistant Examiner*—Nicole Ippolito Rausch

(57) ABSTRACT

Techniques for providing a ribbon-shaped gas cluster ion beam are disclosed. In one particular exemplary embodiment, the techniques may be realized as an apparatus for providing a ribbon-shaped gas cluster ion beam. The apparatus may comprise at least one nozzle configured to inject a source gas at a sufficient speed into a low-pressure vacuum space to form gas clusters. The apparatus may also comprise at least one ionizer that causes at least a portion of the gas clusters to be ionized. The apparatus may further comprise a beam-shaping mechanism that forms a ribbon-shaped gas cluster ion beam based on the ionized gas clusters.

19 Claims, 7 Drawing Sheets

U.S. PATENT DOCUMENTS

2008/0078951 A1* 4/2008 Renau et al. ............ 250/492.21
2008/0078953 A1* 4/2008 Gupta et al. ............ 250/492.21
2008/0078954 A1* 4/2008 Vanderberg et al. ..... 250/492.21

OTHER PUBLICATIONS

Toyoda, et al., "Cluster Ion Beam Processing", 1 page.

Popok, et al., "Cluster Ion Beam Facilities", Interaction of Radiations with Solids, 4th International Conference, p. 376-378, Oct. 3-5, 2001, Minsk, Belarus.

Popok, et al., "Design and Capabilities of a cluster implantation and deposition apparatus: First results on hillock formation under energenic clust ion bombardment", Review of Scientific Instruments, vol. 73, No. 12, p. 4283-4287, Dec. 2002.

Popok, et al., "New Direction in Nanotechnology: Cluster Ion Beam Technique", p. 253-255, 13th International Conference, Microwave and Telecommunication Technology, Sep. 8-12, 2003, Sevastopol, Crimea, Ukraine.

Popok, et al., "Surface Erosion under Cluster Ion Implantation: Crater and Hillock Formation", p. 35-37, 5th International Conference, Interaction of Radiation with Solids, Oct. 6-9, 2003, Minsk, Belarus.

Jacobson, "Using Boron Cluster Ion Implantation to Fabricate Ultra-Shallow Junctions", p. 23-26, Ext. Abs. the 5th International Workshop on Junction Technology, 2005.

Seki, et al., "Development of 1mA Cluster Ion Beam Source", Nuclear Instruments and Methods in Physics Research B, vol. 237, p. 455-458, 2005.

Yamada, et al., "Current Research and Development topics on Gas Cluster Ion-Beam Processes", J. Vac. Sci. Technol. A, vol. 23, No. 4, p. 1090-1099, Jul./Aug. 2005.

* cited by examiner

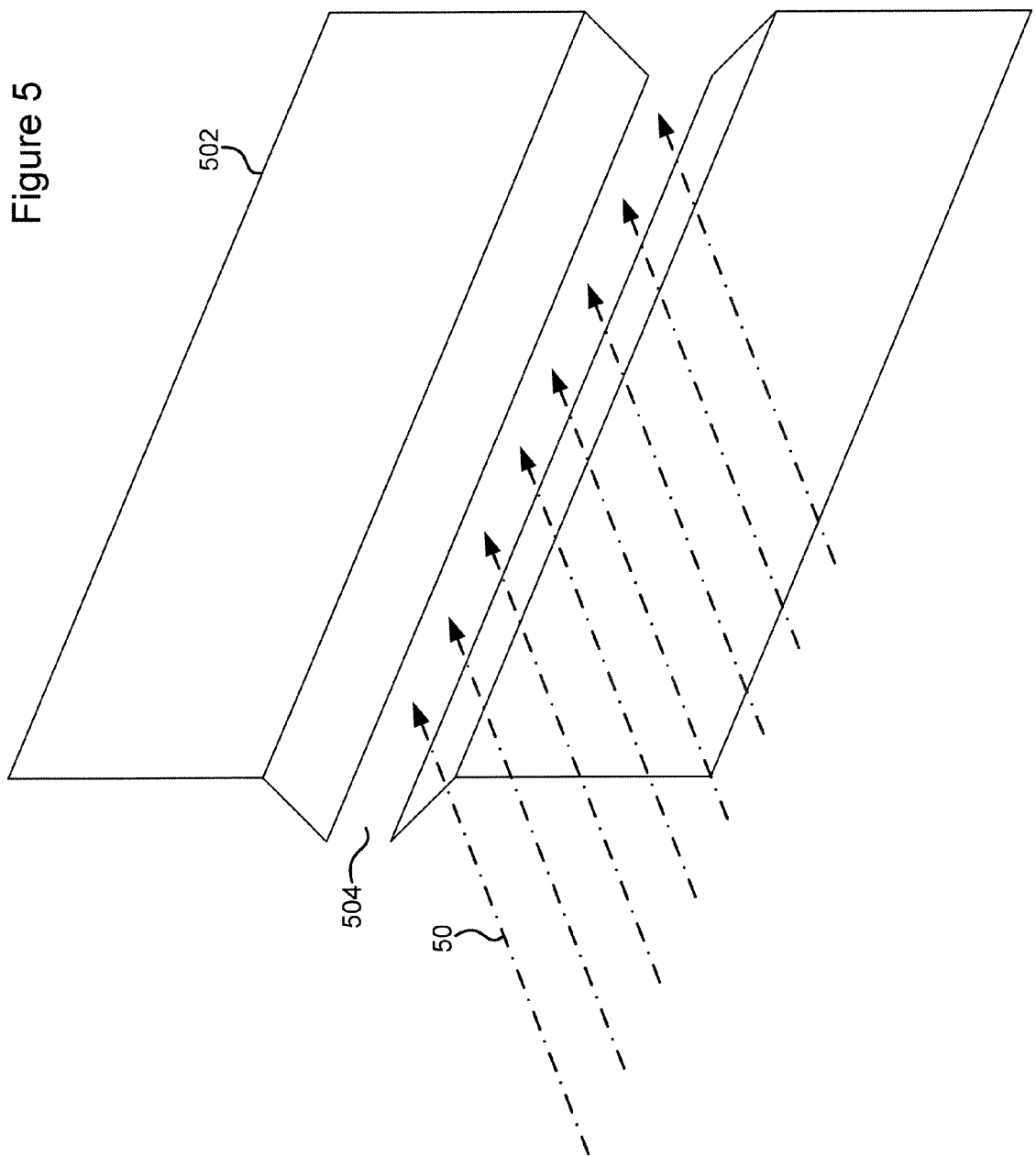

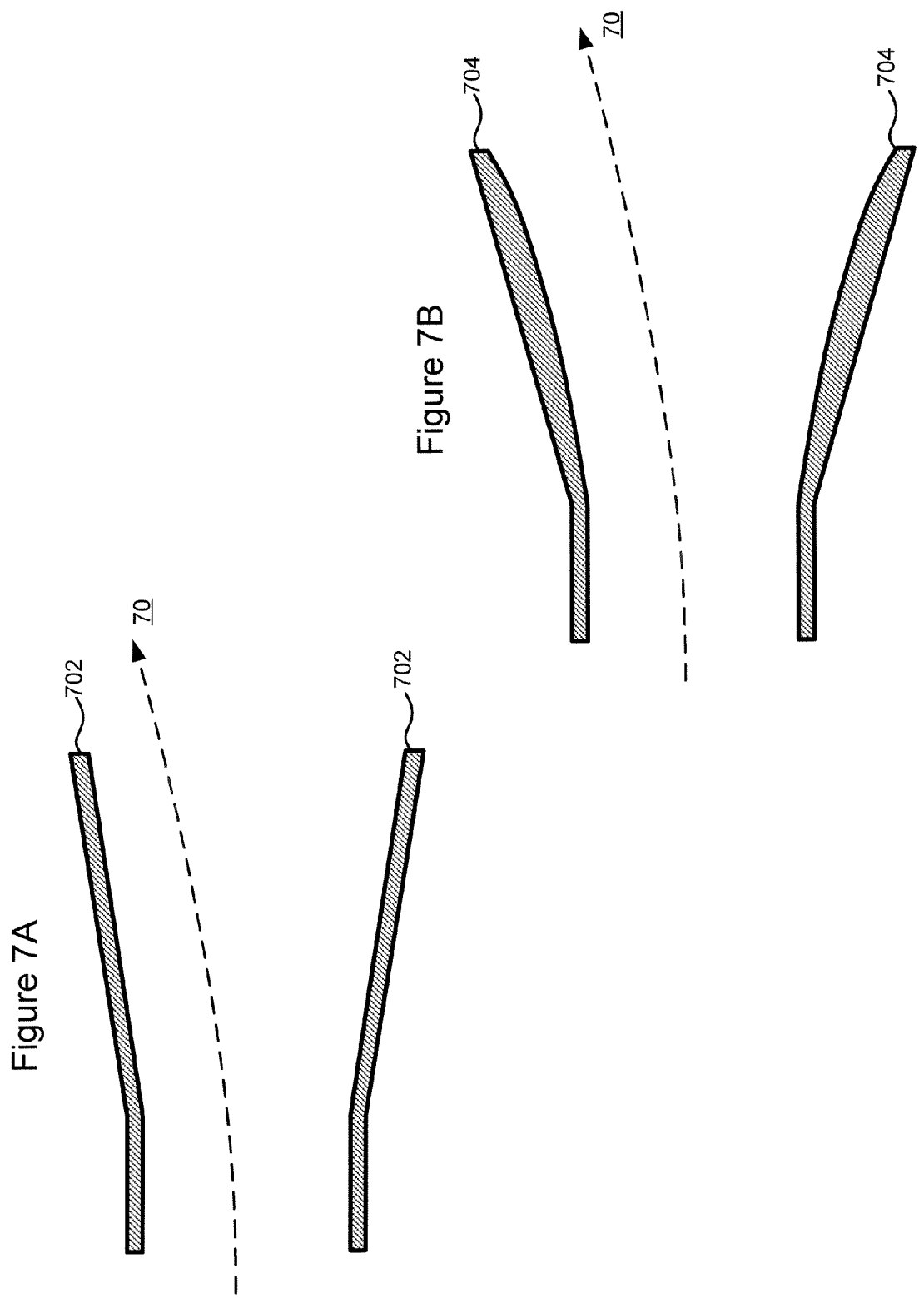

TECHNIQUES FOR PROVIDING A RIBBON-SHAPED GAS CLUSTER ION BEAM

FIELD OF THE DISCLOSURE

The present disclosure relates generally to semiconductor manufacturing equipment and, more particularly, to techniques for providing a ribbon-shaped gas cluster ion beam.

BACKGROUND OF THE DISCLOSURE

Traditional ion implantation is a process of depositing chemical species into a substrate by direct bombardment of the substrate with energized ions. In semiconductor manufacturing, ion implanters are used primarily for doping processes that alter the type and level of conductivity of target materials. A precise doping profile in an integrated circuit (IC) substrate and its thin-film structure is often crucial for proper IC performance. To achieve a desired doping profile, one or more ion species may be implanted in different doses and at different energy levels.

There has been a continuing effort to shrink feature sizes of semiconductor devices. As semiconductor devices are scaled down in size, the depth of related P-N junctions must be reduced accordingly. Such reduced depth P-N junctions are sometimes referred to as shallow or ultra-shallow junctions. In order to form shallow or ultra-shallow junctions, it is necessary to implant dopants with low-energy ions. However, due to fundamental limitations in the extraction and transport of low-energy ions, conventional ion implantation systems may not perform satisfactorily to form shallow or ultra-shallow junctions. In response to this problem, gas cluster ion implantation has been developed to achieve shallow or ultra-shallow implants.

FIG. 1 shows a typical gas cluster ion implantation system 100. The system 100 is typically enclosed in a vacuum housing (not shown). A source gas may be introduced into the vacuum housing via a properly shaped nozzle 102. A suitable source gas may include, for example, one or more inert gases (e.g., argon), oxygen-containing gases (e.g., oxygen and carbon dioxide), nitrogen-containing gases (e.g., nitrogen), and other dopant-containing gases (e.g., diborane). The nozzle 102 may inject the source gas at a high speed (e.g., supersonic speed). Since the vacuum chamber is at a much lower pressure than the source gas, the injected source gas will experience an instant expansion that results in cooling and condensation of the injected source gas. That is, the source gas will condense into a jet 10 of gas clusters wherein each gas cluster may have a few to several thousands atoms or molecules. The cluster jet 10 may then go through a skimmer 104 that removes stray atoms or molecules from the cluster jet 10. The resulting cluster jet 12 may be ionized in an ionizer 106. The ionizer 106 typically produces thermo-electrons and causes them to collide with the gas clusters in the cluster jet 12, thereby ionizing the gas clusters to form a gas cluster ion beam 14. Each gas cluster typically has one positive charge. The gas cluster ion beam 14 may further pass through one or more sets of electrodes 108 that may focus the gas cluster ion beam 14 and/or accelerate it to a desired energy. The gas cluster ion beam 14 may also be filtered through a mass analyzer 110 that selects gas clusters of desired mass(es). For example, the mass analyzer 110 may deflect all monomer ions and other light ions and only allow more massive gas clusters to pass through. Finally, the gas cluster ion beam 14 may be directed to a wafer (not shown) which is typically housed in an end station (not shown). The wafer may be mechanically scanned and/or tilted during an implantation with the gas cluster ion beam 14. A neutralizer 112 may generate electrons to offset charge buildup on the wafer.

The adoption of gas cluster ion implantation significantly improves the performance of ultra shallow junctions. It is now possible to implant atoms to a depth of 5-100 angstroms. So far, however, gas cluster ion implantation has been limited to the use of spot beams of gas clusters. To use a single spot beam in a uniform implantation, the spot beam has to be scanned multiple times across an entire wafer, which may not be efficient for large wafers (which may be up to 300 mm in diameter these days). In addition, the use of spot beams requires a complex design of end stations in order to accommodate two-dimensional wafer movements.

In view of the foregoing, it would be desirable to provide a solution for gas cluster ion implantation which overcomes the above-described inadequacies and shortcomings.

SUMMARY OF THE DISCLOSURE

Techniques for providing a ribbon-shaped gas cluster ion beam are disclosed. In one particular exemplary embodiment, the techniques may be realized as an apparatus for providing a ribbon-shaped gas cluster ion beam. The apparatus may comprise at least one nozzle configured to inject a source gas at a sufficient speed into a low-pressure vacuum space to form gas clusters. The apparatus may also comprise at least one ionizer that causes at least a portion of the gas clusters to be ionized. The apparatus may further comprise a beam-shaping mechanism that forms a ribbon-shaped gas cluster ion beam based on the ionized gas clusters.

In accordance with other aspects of this particular exemplary embodiment, the at least one nozzle may comprise an array of nozzles, wherein the array of nozzles are so arranged as to cause the gas clusters to form a ribbon-shaped jet. The at least one ionizer may cause at least a portion of the ribbon-shaped jet to be ionized, thereby forming a static ribbon-shaped gas cluster ion beam. And, the beam-shaping mechanism may coordinate the formation of the gas clusters by the array of nozzles to shape the static ribbon-shaped gas cluster ion beam.

In accordance with further aspects of this particular exemplary embodiment, the at least one nozzle may comprise a single nozzle that forms a stream of gas clusters. The at least one ionizer may cause at least a portion of the stream of gas clusters to be ionized. And, the beam-shaping mechanism may deflect the ionized stream of gas clusters back and forth at a sufficiently high frequency to form a scanned ribbon-shaped gas cluster ion beam.

In accordance with additional aspects of this particular exemplary embodiment, the at least one nozzle may comprises a single nozzle having an elongated nozzle opening that causes the gas clusters to form a ribbon-shaped jet or a single nozzle having an array of nozzle openings so arranged as to cause the gas clusters to form a ribbon-shaped jet.

In another particular exemplary embodiment, the techniques may be realized as a method for providing a ribbon-shaped gas cluster ion beam. The method may comprise injecting, through at least one nozzle, a source gas at a sufficient speed into a low-pressure vacuum space to form gas clusters. The method may also comprise causing at least a portion of the gas clusters to be ionized. The method may further comprise forming a ribbon-shaped gas cluster ion beam based on the ionized gas clusters.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

FIG. 5 shows an exemplary skimmer that facilitates a ribbon-shaped gas cluster ion beam in accordance with an embodiment of the present disclosure.

FIGS. 7A and 7B illustrate exemplary scanner plates in accordance with embodiments of the present disclosure.

DETAILED DESCRIPTION OF EXEMPLARY EMBODIMENTS

Figure 2:
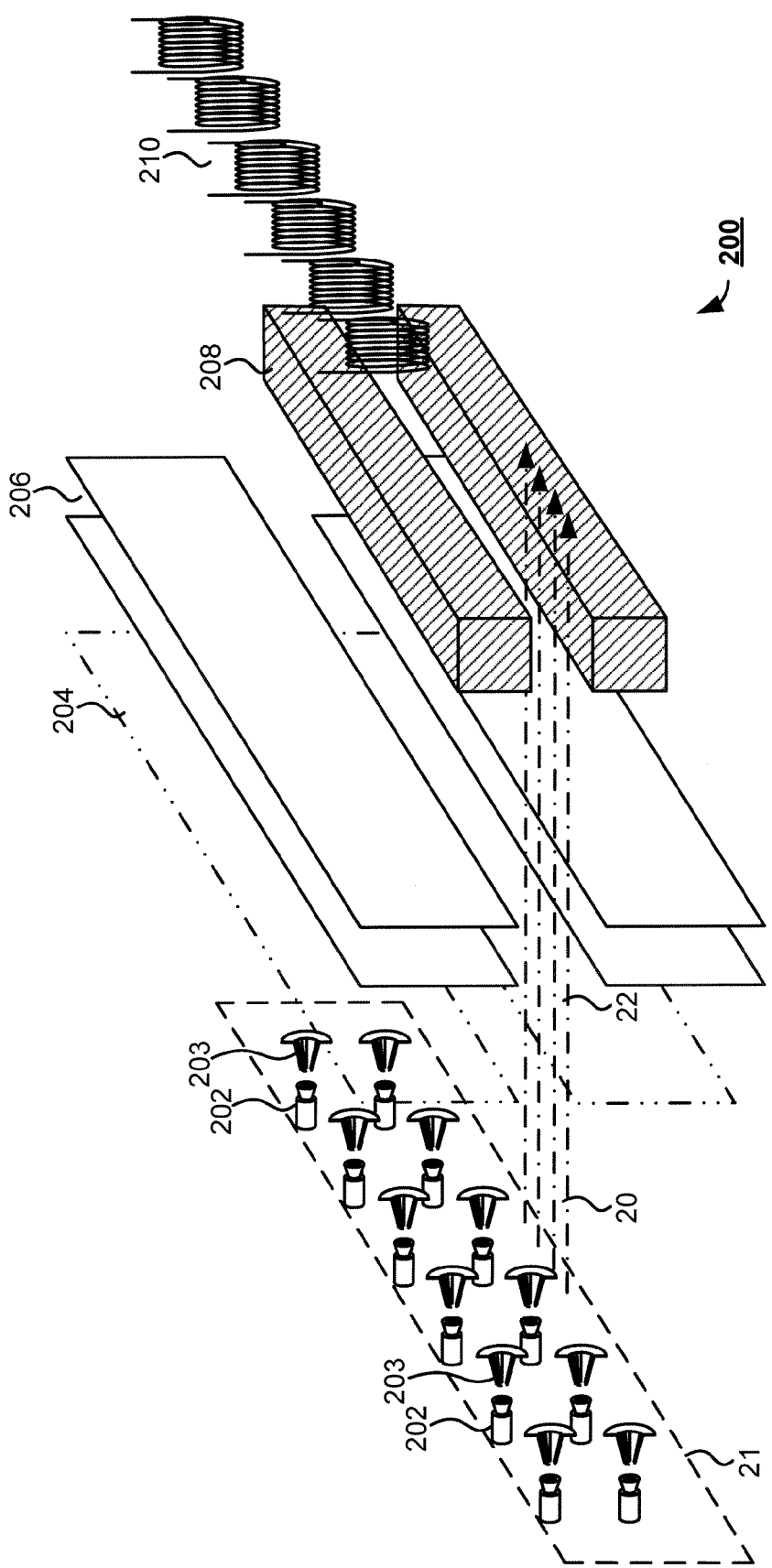
FIG. 2 shows an exemplary system for generating a static ribbon-shaped gas cluster ion beam in accordance with an embodiment of the present disclosure.

Referring to FIG. 2, there is shown an exemplary system 200 for generating a static ribbon-shaped gas cluster ion beam in accordance with an embodiment of the present disclosure. The system 200 may be enclosed in a vacuum chamber (not shown). The system 200 may comprise a plurality of nozzle-skimmer pairs that are arranged in an array 21 having a desired geometry. Each nozzle 202 may be capable of injecting a source gas at a sufficiently high speed (e.g., supersonic speed). The source gas may comprise any of a variety of gases, such as, for example, inert gases (e.g., argon), oxygen-containing gases (e.g., oxygen and carbon dioxide), nitrogen-containing gases (e.g., nitrogen), and other dopant-containing gases (e.g., diborane). The source gas may also be provided by heating up one or more solid substances until they vaporize. Upon injection into the vacuum chamber, the source gas may quickly expand, cool, and condense into a jet of gas clusters near each nozzle. As used hereinafter, a "gas cluster" refers to a group of atoms or molecules that are typically held together by surface tensions or van der Waals forces rather than molecular bonds or covalent bonds. Each corresponding skimmer 203 may deflect uncondensed source gas from the cluster jet. The plurality of nozzle-skimmer pairs may be positioned in close proximity with one another such that, in aggregate, the cluster jets they produce will form a substantially uniform jet of gas clusters (20) that has a two-dimensional cross section of a desired geometry. According to a preferred embodiment, the nozzle-skimmer pairs may be arranged in an elongated rectangular array to produce a ribbon-shaped jet 20. The positioning of the array of nozzle-skimmer pairs may be adjusted to cause the ribbon-shaped jet 20 to have a desired size and gas cluster density.

The gas cluster ion implantation system 200 may also comprise one or more ionizers 204 that ionize at least a portion of the gas clusters in the ribbon-shaped jet 20. There may be a single ionizer 204 adapted to accommodate the ribbon shape of the jet 20. Alternatively, there may be multiple ionizers 204 arranged in an array that spans the width of the ribbon-shaped jet 20. The one or more ionizers 204 may employ any of a variety of electron-generating techniques. For example, traditional thermionic filaments may be used to produce thermo-electrons that can ionize the gas clusters through impact. According to one embodiment, one or more plasma flood guns (PFG's) may be used to provide the electrons needed for ionization of the gas clusters. An array of PFG's may be provided, or a single PFG with one or more slit apertures or an array of exit apertures may be utilized. Ideally, each gas cluster in the ribbon-shaped jet 20 may become ionized with a single positive charge. In practice, some gas clusters may not acquire any charge and some might become overcharged. After passing through the one or more ionizers 204, the ribbon-shaped jet 20 becomes a ribbon-shaped gas cluster ion beam 22 that may continue traveling down the original beam path.

The gas cluster ion beam 22 may be subject to electrostatic manipulation by a series of electrodes 206. The electrodes 206 may accelerate, decelerate, and/or focus the gas cluster ion beam 22. The electrodes 206 may be the same as or similar to those developed for conventional, non-gas cluster ion beams. After passing through the electrodes 206, the gas cluster ion beam 22 may have a more refined shape and a desired energy.

Next, the gas cluster ion beam 22 may pass through a mass analyzer 208 that is adapted to accommodate a ribbon-shaped ion beam. The analyzer 208 may comprise a conventional C or H magnet or a window frame magnet. A main function of the analyzer 208 may be to remove light-weight ions (e.g., monomers) from the gas cluster ion beam 22. According to embodiments of the present disclosure, the analyzer 208 may be so configured to cause negligible deflection of heavy gas clusters.

The gas cluster ion beam 22 may then be directed towards a target wafer in an end station (not shown). One or more neutralizers 210 may be positioned near both the beam path and the target wafer. The one or more neutralizers 210 may provide low-energy electrons that help offset charge buildup on the target wafer. The end station does not need to accommodate two-dimensional scans of the target wafer as required for spot beam ion implantations. Instead, the end station may have a simplified design which facilitates one-dimensional scans and tilting of the target wafer. The ribbon width of the gas cluster ion beam 22 is typically wider than the width of a target wafer. As a result, a single scan of the target wafer perpendicular to the ribbon width may be sufficient to cover the entire wafer surface.

According to embodiments of the present disclosure, it may be desirable to control the ribbon-shaped gas cluster ion beam 22 with additional beam-shaping mechanisms (not shown in FIG. 2). For example, in order to achieve a desired uniformity in gas cluster distribution and/or charge distribution within the ion beam 22, it may be beneficial to coordinate the generation of gas clusters by the plurality of nozzles 202. The amount of source gas supplied to each nozzle 202 as well as the injection speed and angles may be programmed and fine-tuned to ensure a desired output of the ribbon-shaped jet 20 of gas clusters. Similar programming and coordination may be applied to other components such as the ionizers 204 and neutralizers 210. Other known beam-shaping techniques applicable to traditional ribbon-shaped ion beams may also be adapted to shape the ribbon-shaped gas cluster ion beam 22.

Figure 3:
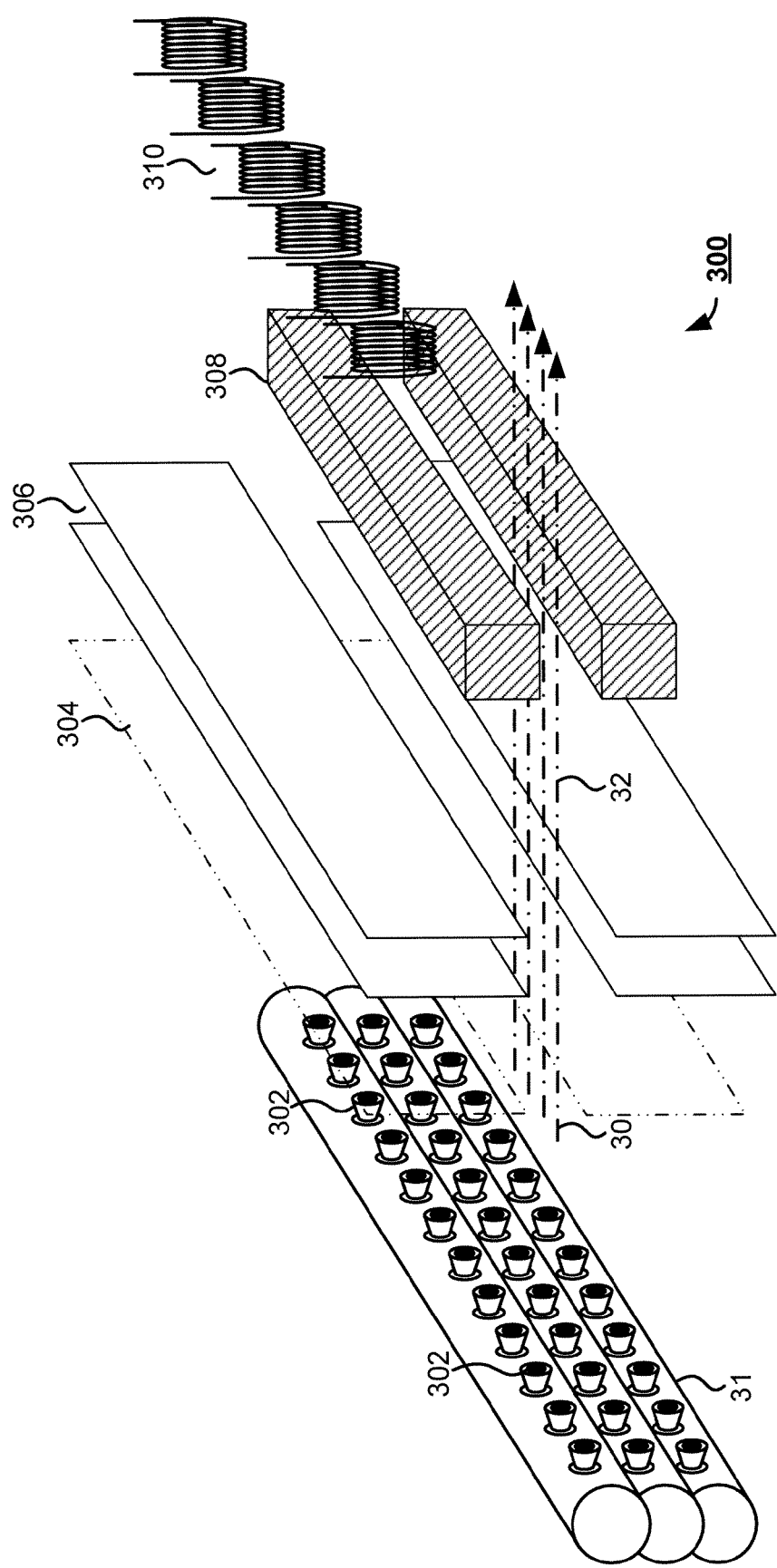
FIG. 3 shows another exemplary system for generating a static ribbon-shaped gas cluster ion beam in accordance with an embodiment of the present disclosure.

FIG. 3 shows an exemplary system 300 for generating a static ribbon-shaped gas cluster ion beam in accordance with an embodiment of the present disclosure. Compared with the system 200 in FIG. 2, the system 300 comprises a different array of nozzles 302. The nozzles 302 may not be independently positioned as the individual nozzles 202. Rather, each row of the nozzles 302 may be pre-arranged along a gas tube 31. One or more gas tubes 31 may collectively produce a ribbon-shaped jet of gas clusters (30). One skimmer (not shown) may be used for each row of nozzles 302 or for all rows. One or more ionizers 304 may ionize gas clusters in the ribbon-shaped jet 30, thereby forming a ribbon-shaped gas cluster ion beam 32. The gas cluster ion beam 32 may then pass through electrodes 306, a mass analyzer 308, and a neutralizer 310 before striking a target wafer (not shown).

Figure 4A:
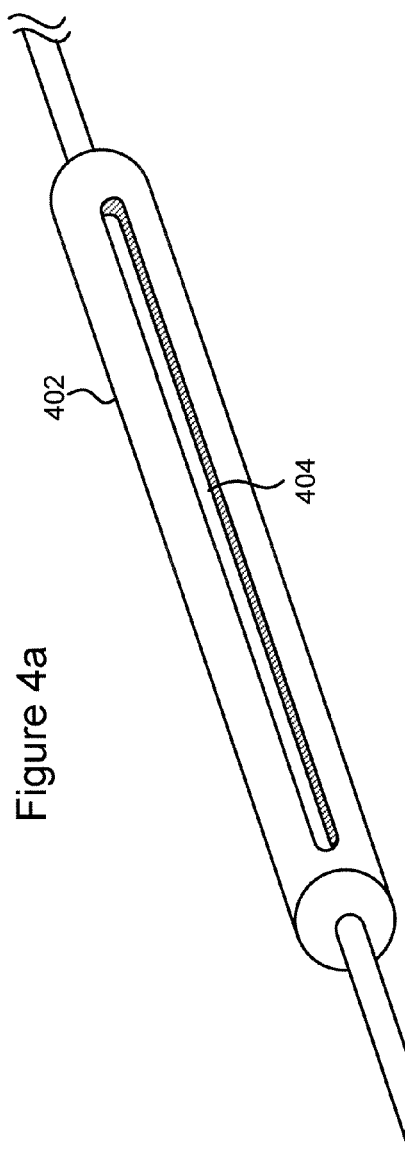
FIGS. 4a and 4b show exemplary nozzle designs for providing a ribbon-shaped gas cluster ion beam in accordance with an embodiment of the present disclosure.
Figure 4B:
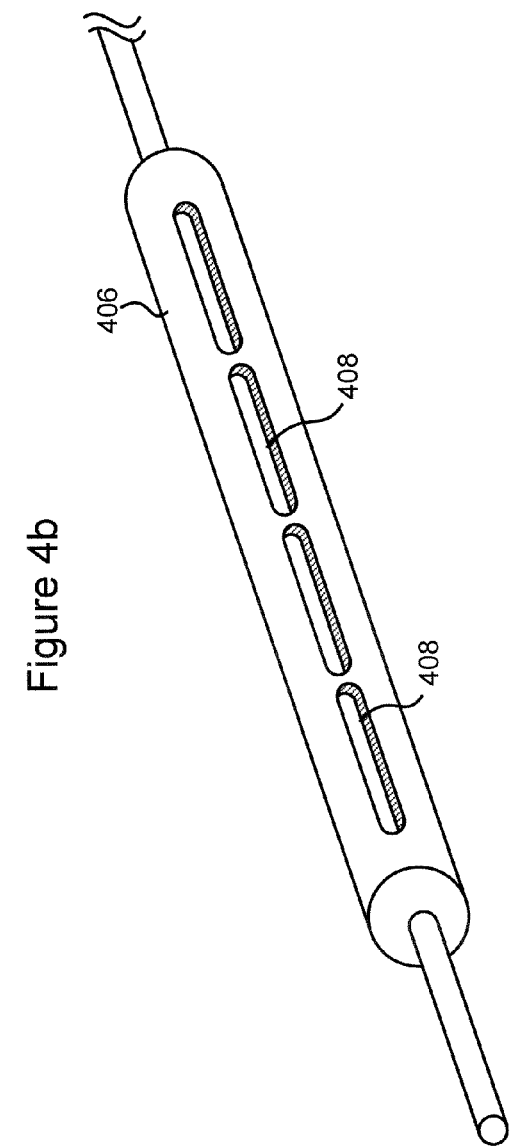

FIGS. 4a and 4b show exemplary nozzle designs for providing a ribbon-shaped gas cluster ion beam in accordance with an embodiment of the present disclosure. FIG. 4a shows a gas tube 402 having an elongated nozzle opening 404 along one side. The elongated shape of the nozzle opening 404 may help create a ribbon-shaped jet of gas clusters without requiring multiple nozzles as shown in FIGS. 2 and 3. FIG. 4b shows a gas tube 406 with multiple elongated nozzle openings 408.

FIG. 5 shows an exemplary skimmer 502 that facilitates a ribbon-shaped gas cluster ion beam in accordance with an embodiment of the present disclosure. The skimmer 502 may have an elongated slit aperture 504 to allow a ribbon-shaped cluster jet 50 to pass through and to deflect particles or clusters whose directions of movement are not sufficiently aligned with the slit aperture 504.

Figure 1:
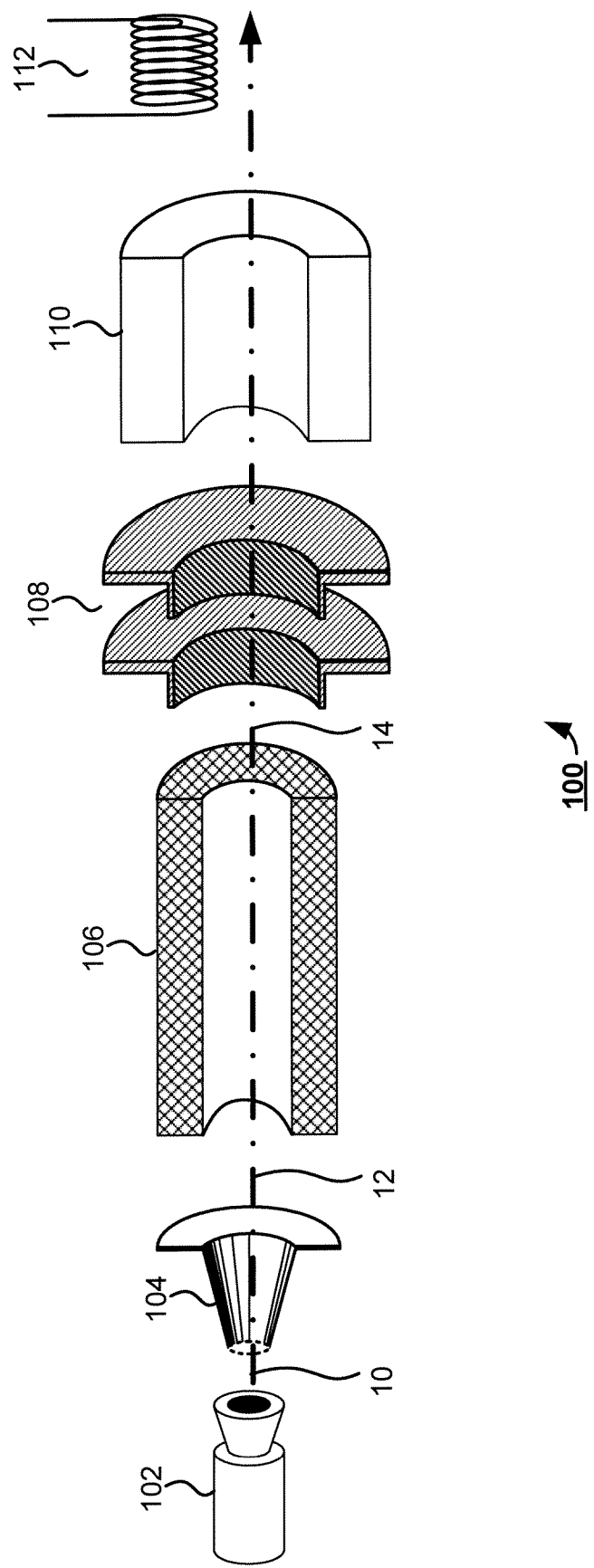
FIG. 1 shows a traditional gas cluster ion implantation system.
Figure 6:
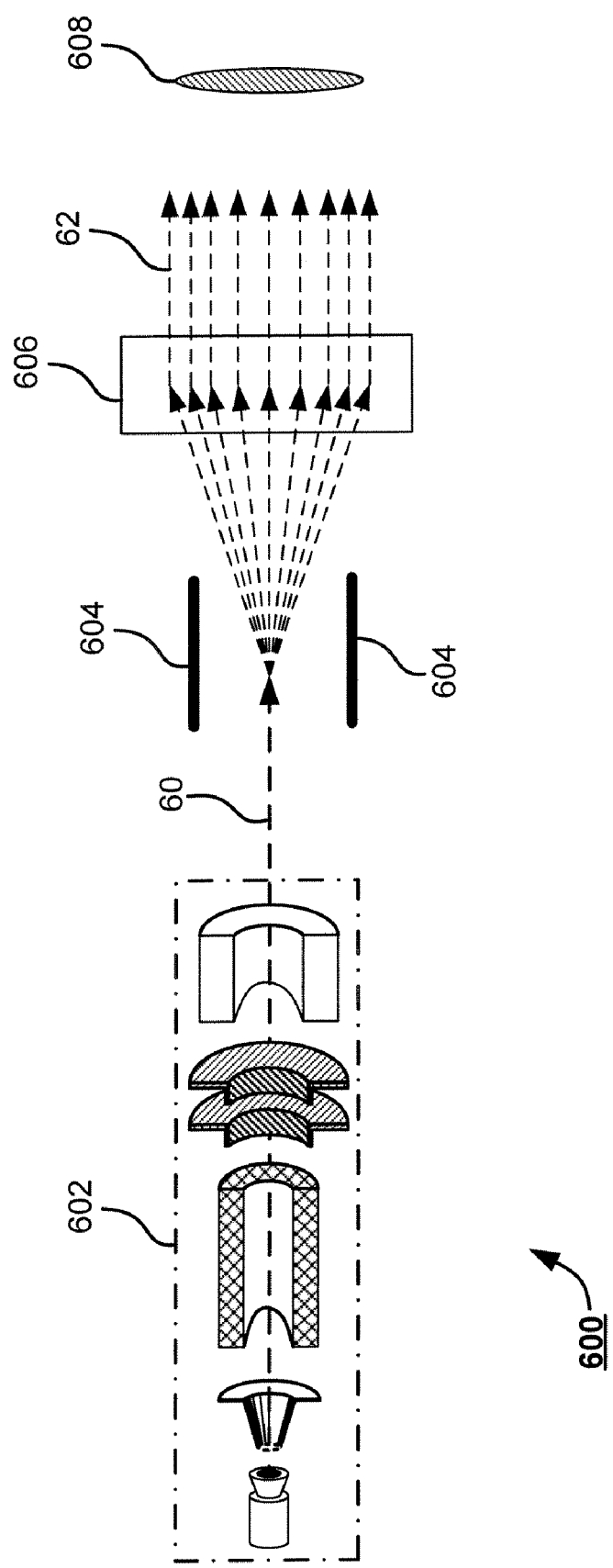
FIG. 6 shows an exemplary system for generating a scanned ribbon-shaped gas cluster ion beam in accordance with an embodiment of the present disclosure.

FIG. 6 shows an exemplary system 600 for generating a scanned ribbon-shaped gas cluster ion beam in accordance with an embodiment of the present disclosure. The system 600 may comprise components 602, similar to those illustrated in FIG. 1, that generate a single gas cluster ion beam 60 (i.e., a spot beam). The gas cluster ion beam 60 may be controllably deflected by a set of parallel plates 604 or other deflection mechanisms. The deflection may be achieved with an electrostatic force, a magnetic force, an electromagnetic force, or a combination thereof. The gas cluster ion beam 60 may be scanned, i.e., deflected back and forth, at a sufficiently high frequency (e.g., 100-1000 Hz) such that the parallel plates 604 (or other deflection mechanisms) output a plurality of beamlets. According to one embodiment, one or more additional sets of parallel plates may be implemented for the scanning. According to another embodiment, multipoles may be used in place of the parallel plates 604. According to yet another embodiment, the parallel plates 604 may be replaced by a pair of plates that are at an angle with each other. One exemplary embodiment of the non-parallel scanner plates is shown in FIG. 7A, where a pair of plates 702 are initially parallel to each other and then fan out to give a scanned ion beam 70 a large exit. Another exemplary embodiment is shown in FIG. 7B, wherein a pair of plates 704 have their fan-out portion curved to prevent the ion beam 704 from hitting the plates 704.

The scanned gas cluster ion beam may be further shaped by an electrostatic collimator 606 having multiple electrodes that are individually biased and/or shaped to produce a desired electrostatic field configuration. The electrostatic field configuration may accelerate the gas cluster ions to a desired final energy and may produce a scanned ribbon-shaped gas cluster ion beam 62 with substantially parallel beamlets. The scanned ribbon-shaped gas cluster ion beam 62 may then impact a target wafer 608 at a uniform, controlled incident angle. Exemplary electrostatic collimation techniques may be found in U.S. Pat. Nos. 5,091,655, 5,177,366, 6,774,377, 5,180,918 and 4,942,342, each of which is incorporated by reference in its entirety.

The scanned ribbon-shaped gas cluster ion beam 62 may be wider than the target wafer 608, such that a 1-D mechanical scanning of the target wafer 608 may be sufficient for a beam coverage of the entire wafer surface.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. An apparatus for providing a ribbon-shaped gas cluster ion beam, the apparatus comprising:
   an array of nozzles configured to inject a source gas at a sufficient speed into a low-pressure vacuum space to form gas clusters in a ribbon-shaped jet;
   at least one ionizer that causes at least a portion of the gas clusters to be ionized; and
   a beam-shaping mechanism that forms a ribbon-shaped gas cluster ion beam based on the ionized gas clusters.

2. The apparatus according to claim 1, wherein:
   the at least one ionizer causes at least a portion of the ribbon-shaped jet to be ionized, thereby forming a static ribbon-shaped gas cluster ion beam; and
   the beam-shaping mechanism coordinates the formation of the gas clusters by the array of nozzles to shape the static ribbon-shaped gas cluster ion beam.

3. The apparatus according to claim 1, wherein the at least one ionizer comprises one or more plasma flood guns.

4. The apparatus according to claim 1, further comprising:
   at least one skimmer that removes from the gas clusters uncondensed particles of the injected source gas.

5. The apparatus according to claim 1, further comprising:
   a plurality of electrodes that focuses the ribbon-shaped gas cluster ion beam.

6. The apparatus according to claim 1, further comprising:
   a plurality of electrodes that accelerate the ribbon-shaped gas cluster ion beam to a desired energy.

7. The apparatus according to claim 1, further comprising:
   a mass analyzer that removes undesired particles from the ribbon-shaped gas cluster ion beam.

8. The apparatus according to claim 1, further comprising:
   one or more neutralizers that offset charge buildup on a target wafer.

9. The apparatus according to claim 1, wherein the ribbon-shaped gas cluster ion beam is at least as wide as a target wafer.

10. The apparatus according to claim 9, further comprising:
an end station that houses the target wafer, wherein the end station is adapted to scan the target wafer across the ribbon-shaped gas cluster ion beam in a single-dimensional movement.

11. A method for providing a ribbon-shaped gas cluster ion beam, the method comprising the steps of:
injecting, through an array of nozzles, a source gas at a sufficient speed into a low-pressure vacuum space to form gas clusters in a ribbon-shaped jet;
causing at least a portion of the gas clusters to be ionized; and
forming a ribbon-shaped gas cluster ion beam based on the ionized gas clusters.

12. The method according to claim 11, further comprising:
causing at least a portion of the ribbon-shaped jet to be ionized, thereby forming a static ribbon-shaped gas cluster ion beam; and
coordinating the formation of the gas clusters by the array of nozzles to shape the static ribbon-shaped gas cluster ion beam.

13. The method according to claim 11, further comprising:
removing from the gas clusters uncondensed particles of the injected source gas.

14. The method according to claim 11, further comprising:
focusing the ribbon-shaped gas cluster ion beam with a plurality of electrodes.

15. The method according to claim 11, further comprising:
accelerating the ribbon-shaped gas cluster ion beam to a desired energy with a plurality of electrodes.

16. The method according to claim 11, further comprising:
removing undesired particles from the ribbon-shaped gas cluster ion beam with a mass analyzer.

17. The method according to claim 11, further comprising:
offsetting charge buildup on a target wafer with one or more neutralizers.

18. The method according to claim 11, wherein the ribbon-shaped gas cluster ion beam is at least as wide as a target wafer.

19. The method according to claim 18, further comprising:
scanning the target wafer across the ribbon-shaped gas cluster ion beam in a single-dimensional movement.

* * * * *